(12) United States Patent
Kikuchi et al.

(10) Patent No.: US 7,791,946 B2
(45) Date of Patent: Sep. 7, 2010

(54) SEMICONDUCTOR DEVICE AND METHOD FOR CONTROLLING A SEMICONDUCTOR DEVICE

(75) Inventors: Keiichirou Kikuchi, Aizuwakamatsu (JP); Hiroaki Wada, Aizuwakamatsu (JP); Norihiro Yamaki, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 140 days.

(21) Appl. No.: 12/166,288

(22) Filed: Jul. 1, 2008

(65) Prior Publication Data
US 2009/0010069 A1    Jan. 8, 2009

(30) Foreign Application Priority Data
Jul. 2, 2007    (JP) .............................. 2007-174659

(51) Int. Cl.
*G11C 16/26*    (2006.01)

(52) U.S. Cl. .............. 365/185.21; 365/185.09; 365/185.2; 365/185.24; 365/210.1

(58) Field of Classification Search ............... None
See application file for complete search history.

(56) References Cited

U.S. PATENT DOCUMENTS

| 6,845,052 B1* | 1/2005 | Ho et al. ..................... 365/149 |
| 7,236,399 B2* | 6/2007 | Chevallier .............. 365/185.22 |

* cited by examiner

*Primary Examiner*—Hoai V Ho
*Assistant Examiner*—James G Norman

(57) ABSTRACT

The present invention is directed to a semiconductor device having a non-volatile memory cell 18, and a readout circuit 102 which reads out data of the memory cell 18 DATA using a first data DATA1 obtained by sensing a first reference level REF1 for reading out the data of the memory cell 18 and a level of the memory cell 18 CORE and using a second data DATA2 obtained by sensing a second reference level REF2 for reading out the data of the memory cell 18 and the level of the memory cell 18 CORE, and to a controlling method for the same.

13 Claims, 10 Drawing Sheets

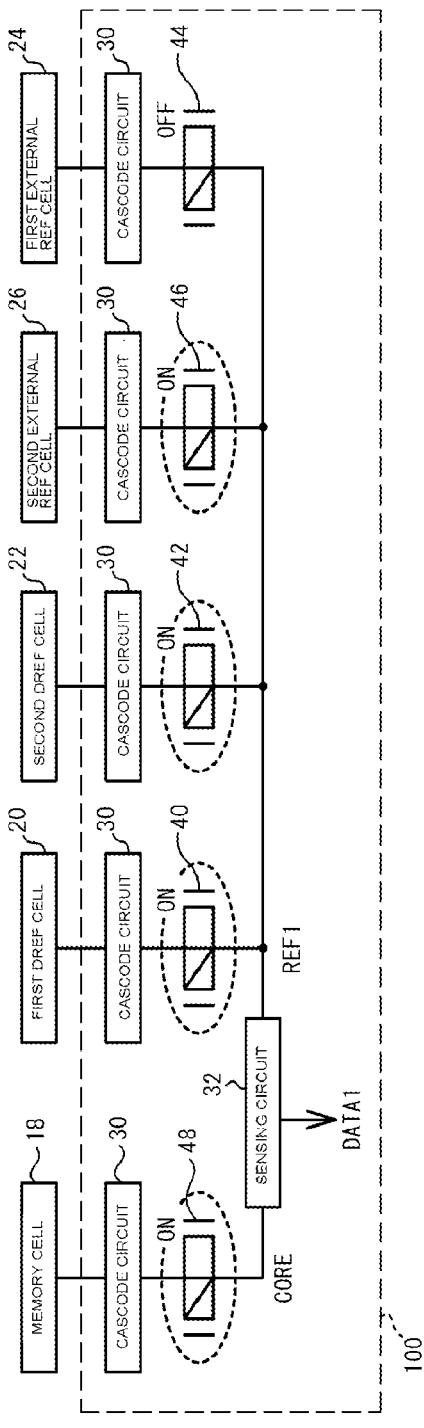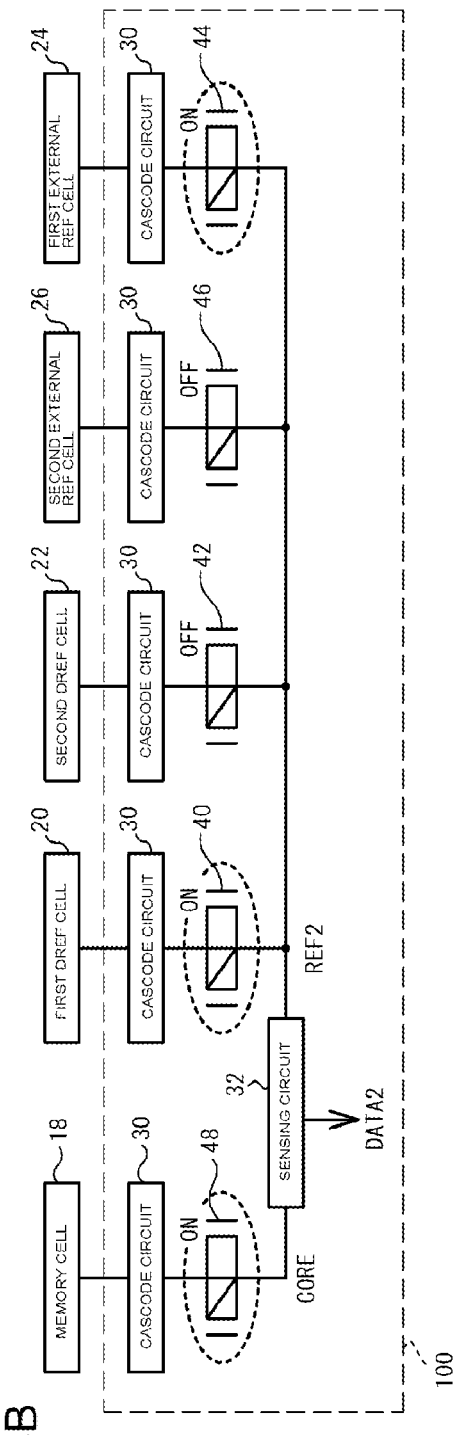
FIG.4A
FIG.4B

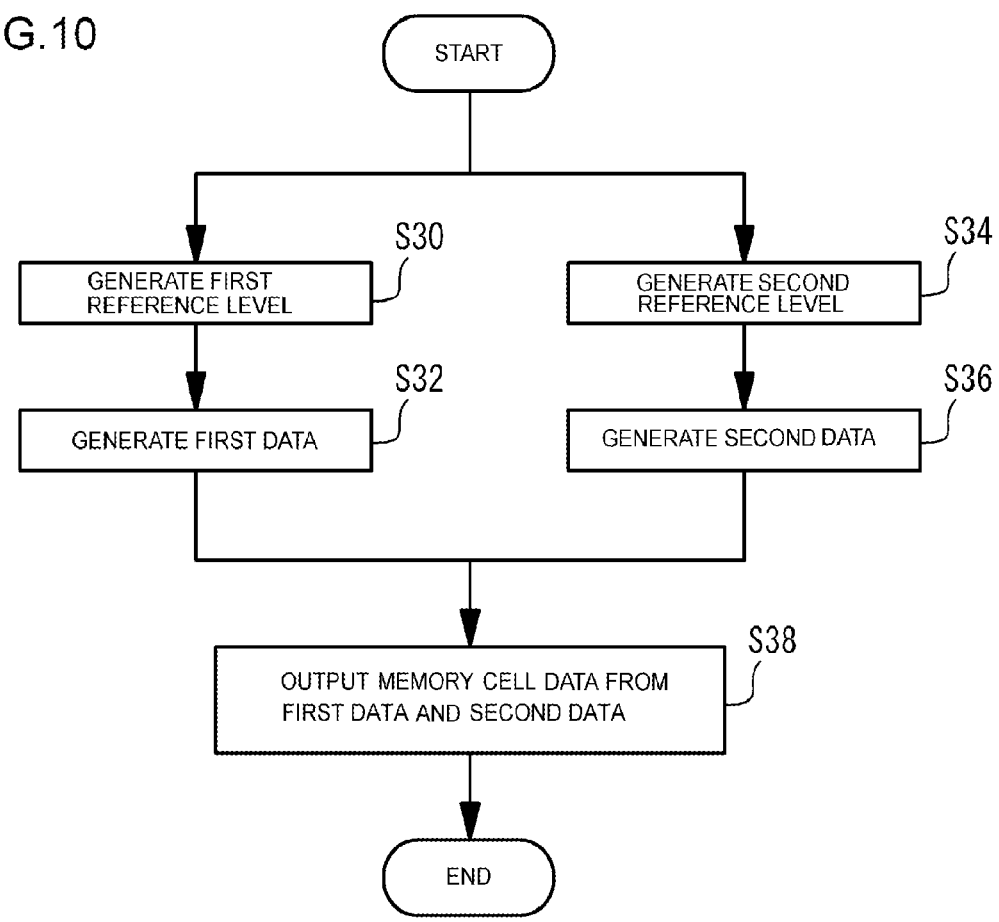

US 7,791,946 B2

SEMICONDUCTOR DEVICE AND METHOD FOR CONTROLLING A SEMICONDUCTOR DEVICE

CROSS-REFERENCE TO RELATED APPLICATIONS

The present invention is based on Japanese Patent Application No. 2007-174659 filed on Jul. 2, 2007, the disclosure of which is hereby incorporated by reference.

TECHNICAL FIELD

The present invention relates to a semiconductor device and a controlling method for the same, and more particularly, a semiconductor device having a dynamic reference cell and a controlling method for the same.

BACKGROUND OF THE INVENTION

In recent years, a non-volatile memory which is a data re-writable semiconductor device has been widely used. In a typical non-volatile memory, data is stored by accumulating electric charges in a charge accumulation layer of a transistor included in a memory cell. There are a floating gate type non-volatile memory which uses a floating gate as a charge accumulation layer and a silicon oxide nitride oxide silicon (SONOS) type non-volatile memory which accumulates electric charges in a trap layer including an insulation film of a nitride silicon layer and such.

Reading out data from the non-volatile memory is carried out by the comparison of a reference level and the level of a memory cell. As for the reference level, an average level of a first reference cell in a level of data 0 and of a second reference cell in a level of data 1 is used as the reference level.

As with an SONOS type flash memory, in a non-volatile memory which uses an insulation film as a charge accumulation layer, when repeatedly writing or erasing a memory cell, a charge loss or a charge gain caused by being left standing after writing or erasing becomes large, and a phenomenon of changes in level of the memory cell occurs. Therefore, as disclosed in Japanese Patent Application Publication No. JP-A-2003-257188, a method using a dynamic reference cell which has the same writing and erasing history as a memory cell in a memory cell array as a reference cell has been used.

SUMMARY OF THE INVENTION

It is an object of the present invention to prevent a false recognition of memory cell data even when a memory cell that exhibits an unusual behavior during standing time is included.

According to an aspect of the present invention, there is provided a semiconductor device including: a non-volatile memory cell, and a readout circuit that reads out data of the memory cell by using first data obtained by sensing a first reference level used for reading out the data of the memory cell and a level of the memory cell and second data obtained by sensing a second reference level used for reading out the data of the memory cell and the level of the memory cell. According to the present invention, when a memory cell that exhibits an unusual behavior is included, by setting a reference level accordingly to the unusual behavior, such a memory cell exhibiting the unusual behavior can be saved.

According to another aspect of the present invention, there is provided a method for controlling a semiconductor device including: generating first data by sensing a first reference level used for reading out data of a memory cell and a level of the memory cell, generating second data by sensing a second reference level used for reading out the data of the memory cell and the level of the memory cell, and reading out the data of the memory cell by using the first data and the second data. According to the present invention, when a memory cell that exhibits an unusual behavior is included, by setting a reference level accordingly to the unusual behavior, such a memory cell exhibiting the unusual behavior can be saved.

BRIEF DESCRIPTION OF THE DRAWINGS

FIG. 4A and FIG. 4B are block diagrams showing a part of a readout circuit of the first embodiment;

FIG. 10 is a flowchart showing the process of the readout circuit of the second embodiment.

DETAILED DESCRIPTION

Figure 1:
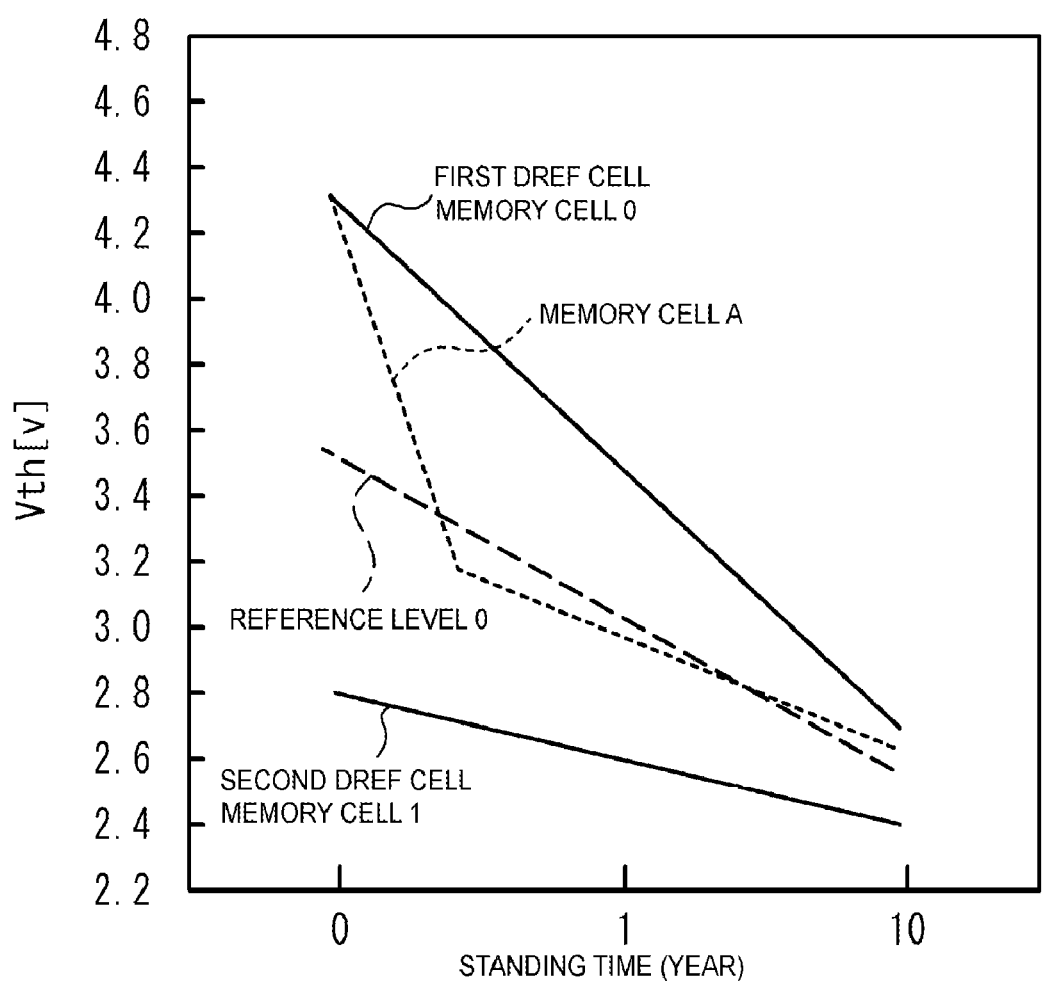
FIG. 1 is a chart for the explanation of reference levels of a first comparative example.

First, the characteristics of a non-volatile memory of a first comparative example will be described. FIG. 1 is a chart showing a threshold voltage of a transistor included in a dynamic reference cell, hereinafter called a dynamic reference cell threshold voltage, and a threshold voltage of a transistor included in a memory cell (simply, referred to as a memory cell threshold voltage) to the standing time after writing or erasing. A first dynamic reference cell (simply, referred to as a first DREF cell) is a reference cell in which a state of writing, i.e. data 0, is stored and a second dynamic reference cell (second DREF cell) is a reference cell in which a state of erasing (data 1) is stored. After data is written or erased, the threshold voltages of the first DREF cell and the memory cell (memory cell 0) in which the state of writing (data 0) is stored similarly decline with standing time. The threshold voltages of the second DREF cell and the memory cell (memory cell 1) in which the state of erasing (data 1) is stored similarly decline. An average level of the level of the first DREF cell and the level of the second DREF cell is defined as a reference level 0. The reference level 0 and the level of the memory cell are compared. Consequently, the data in memory cell is read out. While the level is different from the threshold voltage, in FIGS. 1, 2 and 8, the threshold voltages equivalent to the reference level 0 are shown.

The first DREF cell and the second DREF cell are written or erased at the same time the memory cell in a memory cell array is written or erased. Therefore, as shown in FIG. 1, the threshold voltages of the first DREF cell and the memory cell 0 have the same path of standing time dependencies. Similarly, the threshold voltages of the second DREF cell and the memory cell 1 have the same path of standing time dependencies. Consequently, even when the threshold voltage of the memory cell is changed with standing time, the false recognition of data in data reading is prevented.

Memory cells in a memory cell array, for some reasons, may include a memory cell that exhibits an unusual behavior during the standing time. For example, in reference with FIG. 1, while a memory cell A storing data 0, the threshold voltage of the memory cell A sharply declines and, in a short period of standing time, falls below the reference level 0. Consequently, the memory cell A is falsely recognized as data 1. Particularly, with an SONOS type non-volatile memory having an insulation film, there is a possibility of inclusion of a memory cell which behaves like the memory cell A.

Figure 2:
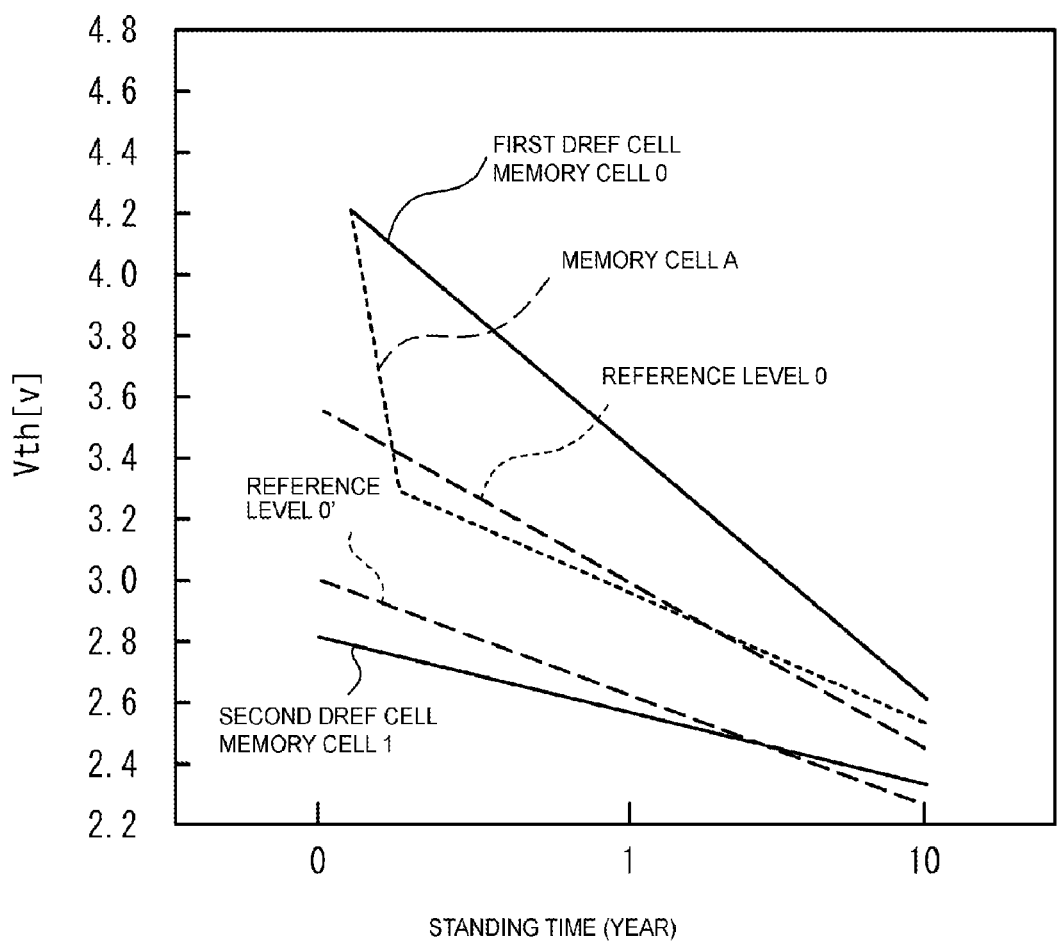
FIG. 2 is a chart for the explanation of reference levels of a second comparative example.

In order to save the memory cell whose threshold voltage sharply declines in an early stage of standing time as the memory cell A shown in FIG. 1, a measure of a comparative example 2 shown in FIG. 2 is conceived. In reference with FIG. 2, by averaging the levels of the first DREF cell, the second DREF cell and an external reference cell (EREF cell), a reference level 0' is created. The EREF cell is independent of the memory cell of the memory cell array. Therefore, as writing or erasing is not carried out, the threshold voltage stays constant with standing time. As just described, by creating the reference level 0' using the first DREF cell, the second DREF cell and the EREF cell, the level of the reference level 0' after writing or erasing is set lower than that shown in FIG. 1. Consequently, even when the threshold voltage of the memory cell A is sharply declined in an early stage of standing time, the false recognition as shown in FIG. 1 is prevented. However, as the reference level 0' falls below the level of the memory cell 1 after a certain standing time, the memory cell storing data 1 is falsely recognized as data 0. Hereafter, embodiments of the present invention which save the memory cell A and prevent the false recognition of the memory cell, as shown in FIG. 2, in an early stage of standing time will be described.

FIRST EMBODIMENT

Figure 3A:
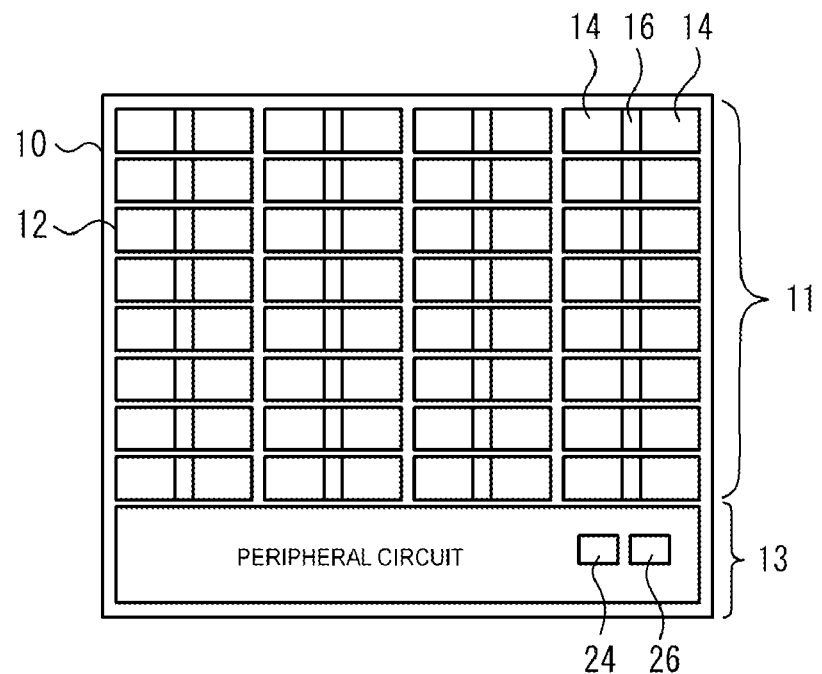
FIG. 3A is a schematic view of a non-volatile memory of the first embodiment and FIG. 3B is a circuit diagram of a sector.

FIG. 3A is a schematic view of a non-volatile memory of a first embodiment. A non-volatile memory 10 includes a memory cell array 11 in which a plurality of memory cells is arranged in a matrix, and a peripheral circuit area 13. The memory cell array 11 has a plurality of sectors 12. Each of the sectors 12 has a core memory cell area 14 which stores data and a reference cell area (DREF cell area) 16 which has a dynamic reference cell. In the peripheral circuit area 13, independent of the memory cell array 11, a first external reference cell (first EREF cell) 24 and a second external reference cell (second EREF cell) 26 are provided.

Figure 3B:
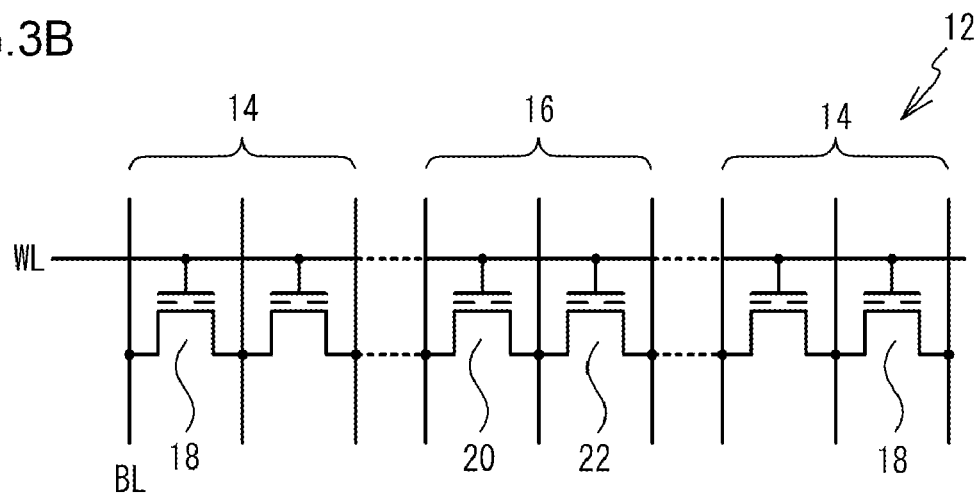

FIG. 3B is a circuit diagram showing one of the sectors 12. The sector 12 is a unit of writing or erasing. The core memory cell area 14 is provided with a non-volatile memory cell 18. The DREF cell area 16 is provided with a first dynamic reference cell (first DREF cell) 20, and a second dynamic reference cell (second DREF cell) 22. The memory cell 18, the first DREF cell 20 and the second DREF cell 22 in the sector 12 are connected to a single or a plurality of word lines WL. When the memory cell 18 is written or erased, the first DREF cell 20 and the second DREF cell 22 in the same sector 12 are also written or erased. More specifically, the first DREF cell 20 and the second DREF cell 22 have the same writing and erasing history as the memory cell 18 in the same sector 12.

Meanwhile, in the peripheral circuit area 13 shown in FIG. 3A, independent of the memory cell array 11, the first external reference cell (first EREF cell) 24 and the second external reference cell (second EREF cell) 26 are provided. The first EREF cell 24 and the second EREF cell 26 are in an initial state of writing or erasing carried out, for example, at the time of manufacturing the non-volatile memory. More specifically, the first EREF cell 24 and the second EREF cell 26 are independent of the writing or erasing history of the memory cell 18.

FIGS. 4A and 4B are block diagrams of proximity of a readout circuit 100 which reads out data of the memory cell 18. In reference with FIG. 4A, the memory cell 18, the first DREF cell 20, the second DREF cell 22, the first EREF cell 24 and the second EREF cell 26 are respectively connected to cascode circuits 30 in the readout circuit 100. The cascode circuits 30 are the circuits to convert the respective currents flowing through the memory cell 18, the first DREF cell 20, the second DREF cell 22, the first EREF cell 24 and the second EREF cell 26 to voltages. Each of the cascode circuits 30 is respectively connected to transfer gates 48, 40, 42, 46 and 44. As the transfer gate 48 is turned on, an output CORE of the cascode circuit 30, i.e. a level of the memory cell, is fed to a sensing circuit 32. As the transfer gates 40, 42, 46 and 44 are respectively turned on, the respective outputs of the cascode circuits 30 are fed to the sensing circuit 32.

In reference with FIG. 4A, a first select signal READ1 is at high level and a second select signal READ2 is at low level. In this case, the transfer gates 40, 42 and 46 are tuned on and the transfer gate 44 is turned off. Consequently, an average of the output of the cascode circuit 30 corresponding to the first DREF cell 20, i.e. the level of the first DREF cell 20, the output of the cascode circuit 30 corresponding to the second DREF cell 22, i.e. the level of the second DREF cell 22, and the output of the cascode circuit 30 corresponding to the second EREF cell 26, i.e. the level of the second EREF cell 26, is fed to the sensing circuit 32 as a first reference level REF1. As described later in reference with FIG. 5, the first reference level REF1 is used for reading out the data of the memory cell 18.

FIG. 4B is the same block diagram as that shown in FIG. 4A, but with the first select signal READ1 being at low level and the second select signal READ2 being at high level. In this case, the transfer gates 40 and 44 are turned on and the transfer gates 42 and 46 are tuned off. Consequently, an average of the level of the first DREF cell 20, and the output of the cascode circuit 30 corresponding to the first EREF cell 24, i.e. the level of the first EREF cell 24, is fed to the sensing circuit 32 as a second reference level REF2. As described later in reference with FIG. 5, the second reference level REF2 is used for reading out the data of the memory cell 18.

Figure 5:
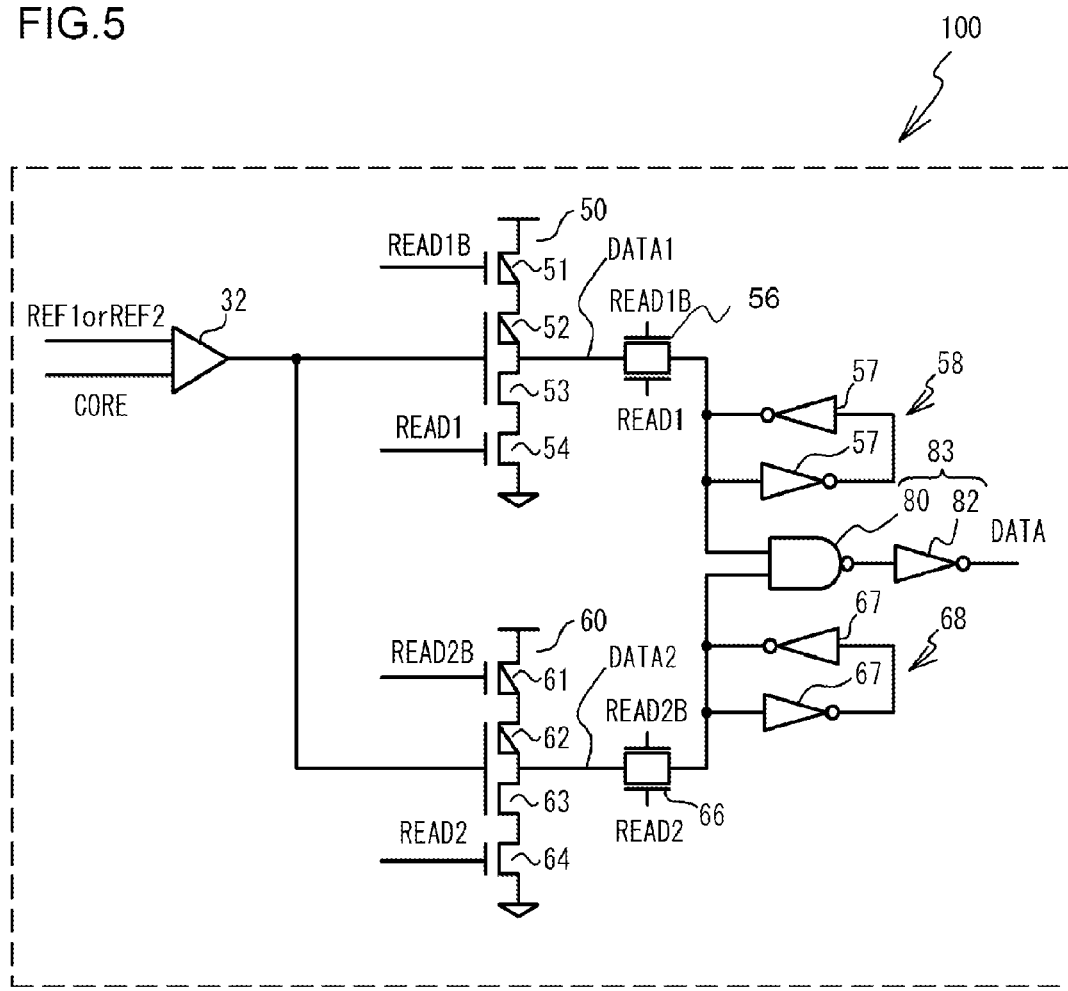
FIG. 5 is a circuit diagram showing a part of the readout circuit of the first embodiment.

FIG. 5 is a circuit diagram showing the subsequent circuits, following the sensing circuit 32 in the readout circuit 100, for reading out the data of the memory cell as 0 or as 1. The sensing circuit 32 compares the REF1 and the CORE and outputs first data DATA1. The sensing circuit 32 also compares the REF2 and the CORE and outputs second data DATA2. For example, when the memory cell is in an erased state, as the potential of the CORE fed to the sensing circuit 32 is lower than the potential of the REF 1, the DATA1 in high level, i.e. 1, is output. When the memory cell is in a programmed state, as the potential of the CORE fed to the sensing circuit 32 is higher than the potential of the REF1, the DATA1 in low level, i.e. 0, is output. When the CORE is lower than REF1, the DATA1 becomes 1 and outputs high level. The same applies to the DATA2. An amplifier 50 includes p-type FETs 51 and 52 and n-type FETs 53 and 54. When the first select signal READ1 is at high level, the amplifier 50 inverting-amplifies the DATA1 and outputs the desired voltage values of low level or high level. In this case, as the transfer gate 56 is on, the DATA1 is stored in a first latch circuit 58, i.e.

a first storage circuit, including inverters 57. More specifically, when the DATA1 is 1, the first latch circuit 58 stores a high level, and when the DATA 1 is 0, the first latch circuit 58 stores a low level.

An amplifier 60 includes p-type FETs 61 and 62 and n-type FETs 63 and 64. When the second select signal READ2 is at high level, the amplifier 60 inverting-amplifies the DATA2 and outputs the desired voltage values of low level or high level. In this case, as the transfer gate 66 is on, the DATA2 is stored in a second latch circuit 68, i.e. a second storage circuit, including inverters 67. When the DATA2 is 0, the second latch circuit 68 stores a low level, and when the DATA2 is 1, the second latch circuit 68 stores a high level.

An AND circuit 83, i.e. the circuit in which a NAND circuit 80 and a NOT circuit 82 are serially connected, carries out an AND process of the DATA1 and DATA2 respectively stored in the first latch circuit 58 and the second latch circuit 68. When both the DATA1 and the DATA2 are at high level, a high level is output. Otherwise, a low level is output. More specifically, when both the first latch circuit 58 and the second latch circuit 68 are at high level, that is to say, when the DATA1 is 1 and the DATA2 is 1, DATA becomes at high level, i.e. 1. When at least one of the DATA1 and the DATA2 is 0, the DATA becomes low level, i.e. 0.

Figure 6:
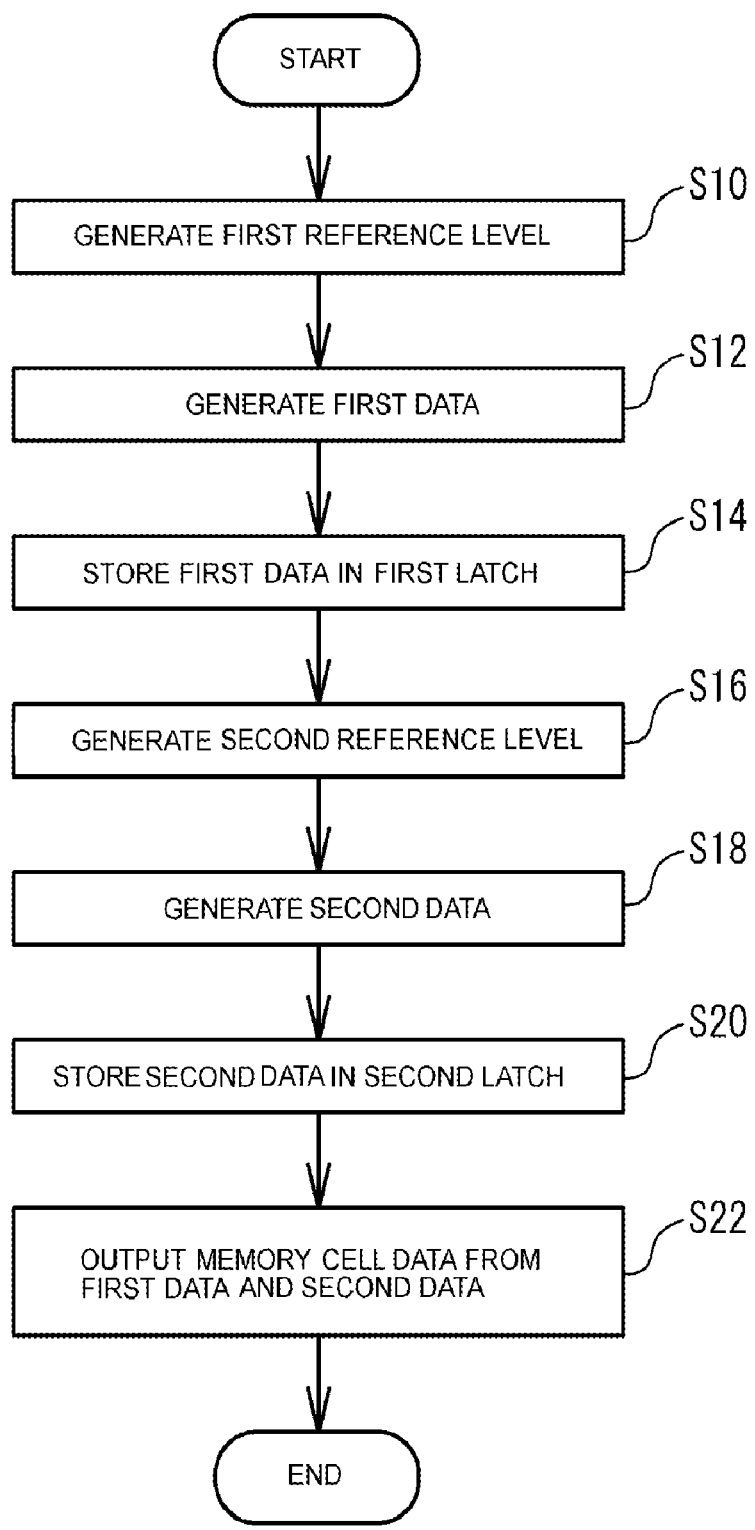
FIG. 6 is a flowchart showing the process of the readout circuit of the first embodiment.
Figure 7:
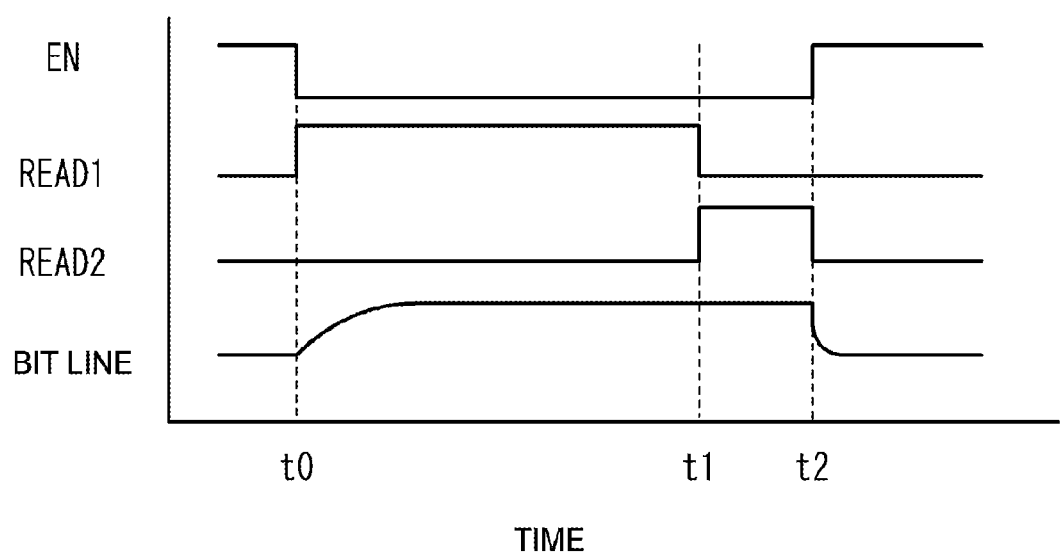
FIG. 7 is a timing chart of the first embodiment.

FIG. 6 is a flowchart showing the operation of the readout circuit 100 of the first embodiment. FIG. 7 is a timing chart of the first embodiment. In reference with FIG. 7, at the time t0, an enable signal EN is set to low level. Therefore, the cascode circuit 30 and the sensing circuit 32 are activated. Consequently, a bit line is charged. Meanwhile, the first select signal READ1 is set to high level and the second select signal READ2 is set to low level. Consequently, as described in reference with FIG. 4A, the readout circuit 100 generates the first reference level REF1 (step S10 in FIG. 6). As described in reference with FIG. 5, the sensing circuit 32 compares the level of the memory cell 18 CORE and the REF1 and generates the DATA1 (step S12 in FIG. 6). The first latch circuit 58 stores the DATA1 (step S14 in FIG. 6).

In reference with FIG. 7, at the time t1, the first select signal READ1 is set to low level and the second select signal READ2 is set to high level. As described in reference with FIG. 4B, the readout circuit 100 generates the second reference level REF2 (step S16 in FIG. 6). As described in reference with FIG. 5, the sensing circuit 32 compares the level of the memory cell 18 CORE and the REF2 and generates the DATA2 (step S118 in FIG. 6). The second latch circuit 68 stores the DATA2 (step S20 in FIG. 6). The AND circuit 83 generates and outputs the data DATA of the memory cell 18 from the DATA1 and DATA2 (step S22 in FIG. 6). In reference with FIG. 7, at the time t2, the enable signal EN is set to high level. Therefore, the cascode circuit 30 and the sensing circuit 32 are inactivated. The second select signal READ2 is set to low level. This completes the readout operation of the memory cell 18.

Figure 8:
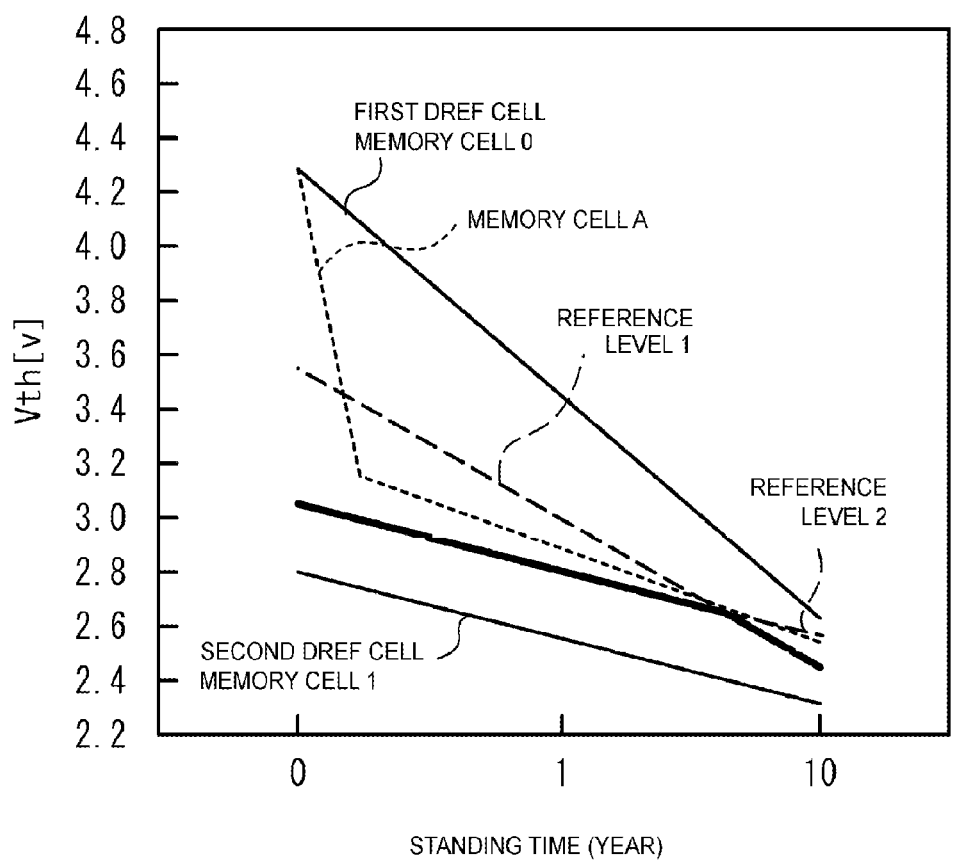
FIG. 8 is a chart for the explanation of reference levels of the first embodiment.

In reference with FIG. 8, a reference level 1 and a reference level 2 respectively represent the threshold voltages equivalent to the REF 1 and the REF2. The readout circuit 100 generates the REF1 from the first DREF cell 20, the second DREF cell 22 and the second EREF cell 26. In this case, the level of the second EREF cell 26 is set so that the reference level 1 lies between the tracks of the first DREF cell and the second DREF cell. The readout circuit 100 also generates the REF2 from the first DREF cell 20 and the first EREF cell 24. In this case, the level of the first EREF cell 24 is set so that the threshold voltage of the reference level 2 in an early stage is more on the side of the second DREF cell than the reference level 1 and that, after the lapse of standing time, the reference level 2 crosses the reference level 1.

As described above, as the data of the memory cell 18 is judged as 1 while the DATA1 is 1 and the DATA2 is 1, when the level of memory cell 18 is lower than both the reference level 1 and the reference level 2, i.e. below a bold solid line shown in FIG. 8, the data of the memory cell 18 is judged as 1. When the level of memory cell 18 is above the bold solid line shown in FIG. 8, the data of the memory cell 18 is judged as 0. Consequently, the false recognition of the data of the memory cell A is prevented.

In accordance with the first embodiment, as described in reference with FIG. 5, the readout circuit 100, using the first data DATA1 obtained by sensing the first reference level REF1 and the level of the memory cell CORE and using the second data DATA2 obtained by sensing the second reference level REF2 and the level of the memory cell CORE, reads out data of the memory cell 18. Therefore, as shown in FIG. 8, in the course of standing time, the slope of the reference level for judging the data of the memory cell 18 is switched. Consequently, when a memory cell that exhibits an unusual behavior, for example as the memory cell A, is included, by setting the reference level accordingly to the unusual behavior, such a memory cell exhibiting the unusual behavior can be saved.

The readout circuit 100 includes the AND circuit 83 which carries out the AND operation of the first data DATA1 and the second data DATA2, and outputs resultant data as the data of the memory cell 18. Here, the AND circuit may be defined as the AND circuit in the general meaning. More specifically, such a configuration using a NOR circuit which produces the DATA as 1 when the DATA1 is 1 and the DATA2 is 1 and otherwise produces the DATA as 0 is included. Consequently, from the reference level REF1 and the second reference level REF2, the reference level in a convex shape, as shown in FIG. 8, may be generated and the reference level in a concave shape may also be generated.

The readout circuit 100, as shown in FIG. 5, using the single sensing circuit 32, carries out the sensing of the first data DATA1 and the sensing of the second data DATA2. The AND circuit 83 outputs the data of the memory cell 18 DATA, from the DATA1 stored in the first latch circuit 58, i.e. the first storage circuit, and the DATA2 stored in the second latch circuit 68, i.e. the second storage circuit. Therefore, compared with a later described second embodiment, the circuit area can be made smaller.

The readout circuit 100 can generate the REF1 from the first DREF cell 20 and the second DREF cell 22 and generate the REF2 from the second DREF cell 22 and the first EREF cell 24. Therefore, as shown in FIG. 8, at an early stage of standing time, the reference level can be set closer to the threshold voltage of the second DREF cell 22 and, as the standing time becomes longer, the reference level can be set between the threshold voltages of the first DREF cell 20 and the second DREF cell 22.

Besides from the first DREF cell 20 and the second DREF cell 22, by generating the REF1 from the second EREF cell 26, the REF1 can be finely adjusted.

As shown in FIG. 4A, the REF1 may be generated by averaging the level of the first DREF cell 20 and the level of the second DREF cell 22 and, as shown in FIG. 4B, the REF2 may be generated by averaging the levels of the first DREF cell and the first EREF cell 24. Consequently, the REF1 and the REF2 can easily be generated. The REF2 may also be generated by averaging the second DREF cell 22 and the first EREF cell 24.

The REF1 may be generated by averaging the level of the first EREF cell 24, the level of the first DREF cell 20 and the level of the second DREF cell 22. Consequently, the REF1 can easily be generated.

SECOND EMBODIMENT

Figure 9A:
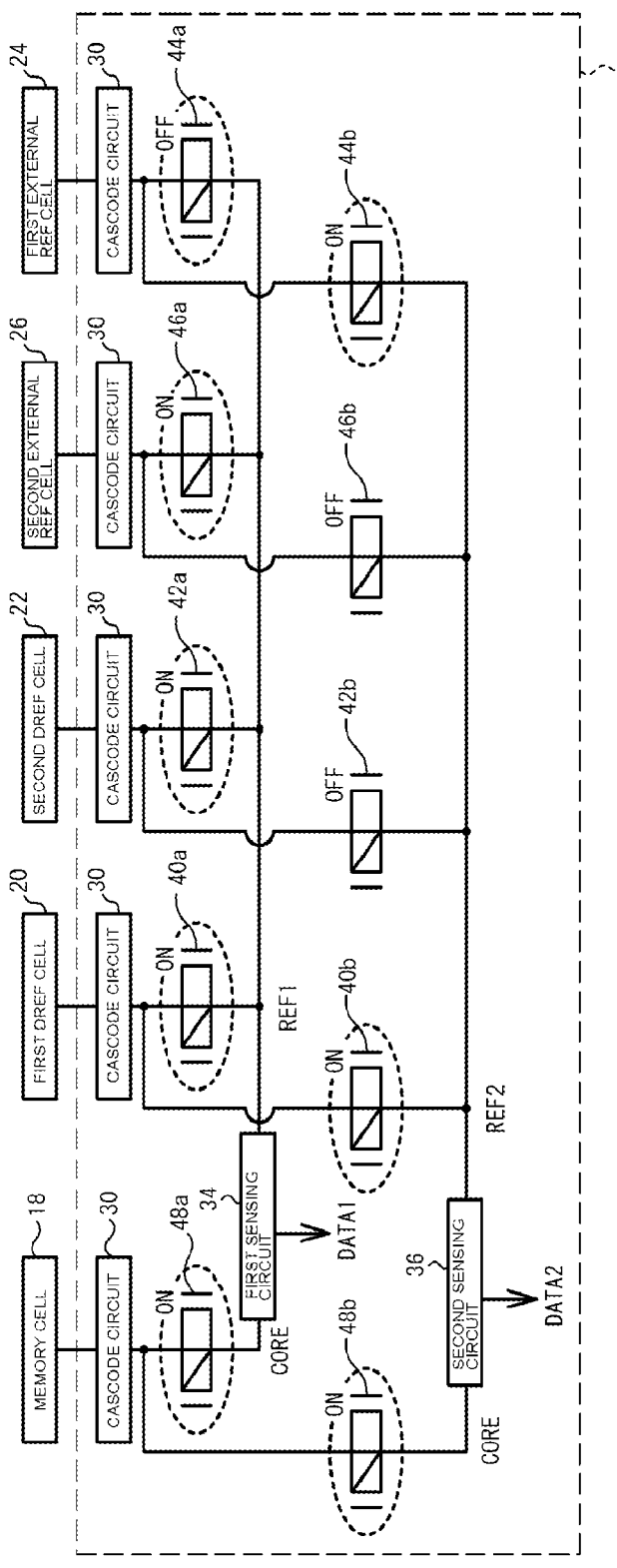
FIG. 9A and FIG. 9B are block diagrams of a readout circuit of the second embodiment.
Figure 9B:
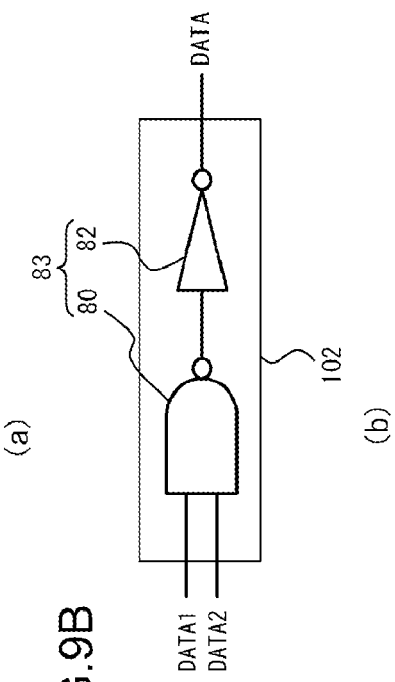

A second embodiment of the present invention is an embodiment of generating the REF1 and the REF2 at the same time. FIGS. 9A and 9B are block diagrams of a non-volatile memory of the second embodiment. In reference with FIG. 9A, a readout circuit 102 of the second embodiment has a first sensing circuit 34 and a second sensing circuit 36. The first sensing circuit 34 and the second sensing circuit 36 are fed with the level of the memory cell 18 CORE from the cascode circuit 30 corresponding to the memory cell 18 via respective transfer gates 48a and 48b.

The first sensing circuit 34 is fed with the first reference level REF1 from the cascode circuits 30 corresponding to the first DREF cell 20, the second DREF cell 22, the first EREF cell 24 and the second EREF cell 26 via respective transfer gates 40a, 42a, 44a and 46a. As the transfer gates 40a, 42a and 46a are turned on, the REF1 becomes an average level of the first DREF cell 20, the second DREF cell 22 and the second EREF cell 26. The first sensing circuit 34 compares the CORE and the REF1, and outputs 0 as the DATA1 when the CORE is higher than the REF1 or outputs 1 as the DATA1 when the CORE is lower than the REF1.

Meanwhile, the second sensing circuit 36 is fed with the second reference level REF2 from the cascode circuits 30 corresponding to the first DREF cell 20, the second DREF cell 22, the first EREF cell 24 and the second EREF cell 26 via respective transfer gates 40b, 42b, 44b and 46b. As the transfer gates 40b and 44b are turned on, the REF2 becomes an average level of the first DREF cell 20 and the first EREF cell 24. The second sensing circuit 36 compares the CORE and the REF2, and outputs 0 as the DATA2 when the CORE is higher than the REF2 or outputs 1 as the DATA2 when the CORE is lower than the REF2.

In reference with FIG. 9B, the respective outputs of the DATA1 and the DATA2 from the first sensing circuit 34 and the second sensing circuit 36 are output, via the AND circuit 83, i.e. the circuit in which the NAND circuit 80 and the NOT circuit 82 are serially connected, as the data of the memory cell 18 DATA. Therefore, when the DATA1 is 1 and the DATA2 is 1, the DATA becomes as 1. When at least one of the DATA1 and the DATA2 is 0, the DATA becomes as 0.

FIG. 10 is a flowchart showing the operation of the readout circuit 102 of the second embodiment. As described in reference with FIG. 9A, the readout circuit 102 generates the first reference level REF1 (step S30 in FIG. 10), and the first sensing circuit 34 generates the first data DATA1 (step S32 in FIG. 10). In parallel with the processes of steps S30 and S32, the readout circuit 102 generates the second reference level REF2 (step S34 in FIG. 10), and the second sensing circuit 36 generates the second data DATA2 (step S36 in FIG. 10). When the DATA1 and the DATA2 are generated, the AND circuit 83 shown in FIG. 9B generates, from the DATA1 and the DATA2, and outputs the data of the memory cell 18 (step S38 in FIG. 10).

In the process described above, as similar to that of the first embodiment, the readout circuit 102 makes, when the threshold voltage of the memory cell 18 is lower than the bold solid line shown in FIG. 8, the data of the memory cell 18 as 1. When the threshold voltage of the memory cell 18 is above the bold solid line shown in FIG. 8, the data of the memory cell 18 is judged as 0.

As in the second embodiment, the first sensing circuit 34 which carries out sensing of the DATA1 from the REF1 and the CORE and the second sensing circuit 36 which carries out sensing of the DATA2 from the REF2 and the CORE can be provided. Consequently, in comparison with the first embodiment, the processing speed can be made faster.

Several aspects of the present invention are summarized below.

According to an aspect of the present invention, there is provided a semiconductor device including: a non-volatile memory cell, and a readout circuit that reads out data of the memory cell by using first data obtained by sensing a first reference level used for reading out the data of the memory cell and a level of the memory cell and second data obtained by sensing a second reference level used for reading out the data of the memory cell and the level of the memory cell. According to the present invention, when a memory cell that exhibits an unusual behavior is included, by setting a reference level accordingly to the unusual behavior, such a memory cell exhibiting the unusual behavior can be saved.

In this arrangement, the readout circuit may include an AND circuit that carries out an AND operation of the first data and the second data and output resultant data as the data of the memory cell.

In this arrangement, the semiconductor device may also include a first storage circuit that stores the first data, and a second storage circuit that stores the second data. The readout circuit may also include a sensing circuit that senses the first data based on the first reference level and the level of the memory cell and senses the second data based on the second reference level and the level of the memory cell. The AND circuit may output the data of the memory cell based on the first data stored in the first storage circuit and the second data stored in the second storage circuit. With this arrangement, the circuit area can be made smaller.

In this arrangement, the readout circuit may also include: a first sensing circuit that senses the first data based on the first reference level and the level of the memory cell, and a second sensing circuit that senses the second data based on the second reference level and the level of the memory cell. With this arrangement, the processing speed can be made faster.

In this arrangement, the semiconductor device may also include: a first dynamic reference cell and a second dynamic reference cell that share a writing and erasing history with the memory cell, and a first external reference cell that is independent of the writing and erasing history of the memory cell. The readout circuit may generate the first reference level based on the first dynamic reference cell and the second dynamic reference cell, and generate the second reference level based on the second dynamic reference cell and the first external reference cell. With this arrangement, the reference level can be set closer to the level of the first dynamic reference cell or the second dynamic reference cell at an early stage of standing time, and the reference level can be set between the levels of the first dynamic reference cell and the second dynamic reference cell as the standing time becomes longer.

In this arrangement, the semiconductor device may also include a second external reference cell that is independent of the writing and erasing history of the memory cell. The readout circuit may generate the first reference level based on the second external reference cell, the first dynamic reference cell, and the second dynamic reference cell. With this arrangement, the first reference level can be finely adjusted based on the second dynamic reference cell.

In this arrangement, the readout circuit may generate the first reference level by averaging levels of the first dynamic reference cell and the second dynamic reference cell, and generate the second reference level by averaging levels of the first external reference cell and one of the first dynamic reference cell and the second dynamic reference cell. With this arrangement, the first reference level and the second reference level can easily be generated.

In this arrangement, the readout circuit may generate the second reference level by averaging levels of the second external reference cell, the first dynamic reference cell, and the second dynamic reference cell. With this arrangement, the second reference level can be finely adjusted by using the second external reference cell.

According to another aspect of the present invention, there is provided a method for controlling a semiconductor device including: generating first data by sensing a first reference level used for reading out data of a memory cell and a level of the memory cell, generating second data by sensing a second reference level used for reading out the data of the memory cell and the level of the memory cell, and reading out the data of the memory cell by using the first data and the second data. According to the present invention, when a memory cell that exhibits an unusual behavior is included, by setting a reference level accordingly to the unusual behavior, such a memory cell exhibiting the unusual behavior can be saved.

The method may also include: generating the first reference level based on the first dynamic reference cell and the second dynamic reference cell that share a writing and erasing history with the memory cell, and generating the second reference level based on a first external reference cell that is independent of the writing and erasing history of the memory cell and one of the first dynamic reference cell and the second dynamic reference cell.

Thus, when a memory cell that exhibits an unusual behavior is included, by setting a reference level accordingly to the unusual behavior, such a memory cell exhibiting the unusual behavior can be saved.

While the preferred embodiments of the present invention have been described in details above, the present invention is not limited to those specific embodiments and, within the spirit and scope of the present invention, various modifications and alterations may be made.

We claim:

1. A semiconductor device, comprising:
   a non-volatile memory cell;
   a first dynamic reference cell and a second dynamic reference cell that share a writing and erasing history with the memory cell; and
   a readout circuit that reads out data of the memory cell by using first data obtained by sensing a first reference level used for reading out the data of the memory cell and a level of the memory cell and second data obtained by sensing a second reference level used for reading out the data of the memory cell and the level of the memory cell, wherein the readout circuit generates the first reference level based on the first dynamic reference cell and the second dynamic reference cell.

2. The semiconductor device according to claim 1, wherein the readout circuit includes an AND circuit that carries out an AND operation of the first data and the second data and outputs resultant data as the data of the memory cell.

3. The semiconductor device according to claim 2, further comprising:
   a first storage circuit that stores the first data; and
   a second storage circuit that stores the second data;
   wherein the readout circuit further includes a sensing circuit that senses the first data based on the first reference level and the level of the memory cell and senses the second data based on the second reference level and the level of the memory cell, and
   the AND circuit outputs the data of the memory cell based on the first data stored in the first storage circuit and the second data stored in the second storage circuit.

4. The semiconductor device according to claim 2, wherein the readout circuit further includes:
   a first sensing circuit that senses the first data based on the first reference level and the level of the memory cell, and
   a second sensing circuit that senses the second data based on the second reference level and the level of the memory cell.

5. The semiconductor device according to claim 2, further comprising:
   a first external reference cell that is independent of the writing and erasing history of the memory cell;
   wherein the readout circuit generates the second reference level based on the second dynamic reference cell and the first external reference cell.

6. The semiconductor device according to claim 5, further comprising:
   a second external reference cell that is independent of the writing and erasing history of the memory cell;
   wherein the readout circuit generates the first reference level based on the second external reference cell, the first dynamic reference cell, and the second dynamic reference cell.

7. The semiconductor device according to claim 5, wherein the readout circuit generates the first reference level by averaging levels of the first dynamic reference cell and the second dynamic reference cell, and generates the second reference level by averaging levels of the first external reference cell and one of the first dynamic reference cell and the second dynamic reference cell.

8. The semiconductor device according to claim 6, wherein the readout circuit generates the second reference level by averaging levels of the second external reference cell, the first dynamic reference cell, and the second dynamic reference cell.

9. A method for controlling a semiconductor device, the method comprising:
   generating first data by sensing a first reference level used for reading out data of a memory cell and a level of the memory cell, wherein the first reference level is generated based on a first dynamic reference cell and a second dynamic reference cell that share a writing and erasing history with the memory cell;
   generating second data by sensing a second reference level used for reading out the data of the memory cell and the level of the memory cell; and
   reading out the data of the memory cell by using the first data and the second data.

10. The method for controlling a semiconductor device according to claim 9, the method further comprising:
    generating the second reference level based on a first external reference cell that is independent of the writing and erasing history of the memory cell and one of the first dynamic reference cell and the second dynamic reference cell.

11. The method for controlling a semiconductor device according to claim 10, wherein generating the first reference level is based on a second external reference cell that is independent of the writing and erasing history of the memory cell, the first dynamic reference cell, and the second dynamic reference cell.

12. The method for controlling a semiconductor device according to claim 10, wherein the first reference level is generated by averaging levels of the first dynamic reference cell and the second dynamic reference cell, and wherein the second reference level is generated by averaging levels of the first external reference cell and one of the first dynamic reference cell and the second dynamic reference cell.

13. The method for controlling a semiconductor device according to claim 11, wherein the second reference level is generated by averaging levels of the second external reference cell, the first dynamic reference cell, and the second dynamic reference cell.

* * * * *